(12) United States Patent
King (10) Patent No.: US 7,592,808 B1
(45) Date of Patent: Sep. 22, 2009

(54) SYSTEM AND METHOD FOR REDUCING MR SCAN TIME USING PARTIAL FOURIER ACQUISITION AND COMPRESSED SENSING

(75) Inventor: Kevin F. King, Menomonee Falls, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/115,786

(22) Filed: May 6, 2008

(51) Int. Cl.
*G01V 3/00* (2006.01)
(52) U.S. Cl. ...................................... 324/307
(58) Field of Classification Search .......... 324/300–322
See application file for complete search history.

(56) References Cited

U.S. PATENT DOCUMENTS

| | | | | |
|---|---|---|---|---|
| 5,697,370 A | * | 12/1997 | Pelc et al. | 600/410 |
| 5,742,163 A | * | 4/1998 | Liu et al. | 324/309 |
| 5,910,728 A | * | 6/1999 | Sodickson | 324/309 |
| 2008/0221433 A1 | * | 9/2008 | Doyle | 600/422 |

* cited by examiner

*Primary Examiner*—Brij B. Shrivastav
*Assistant Examiner*—Dixomara Vargas
(74) *Attorney, Agent, or Firm*—Ziolkowski Patent Solutions Group, SC (57) ABSTRACT

A system and method for reducing the scan time of an MR imaging system using a data acquisition technique that combines partial Fourier acquisition and compressed sensing includes a computer programmed to acquire a partial MR data set in k-space along a phase encoding direction, the data set having missing data in the phase encoding direction due to the omission of phase encoding steps. The computer is further programmed to generate an estimate of a reconstructed image, compensate the partial MR data set for the missing data, and reconstruct an MR image by iteratively minimizing the total squared difference between the k-space data of the estimate of the reconstructed image and the measured k-space data of the compensated partial MR data set.

20 Claims, 10 Drawing Sheets

SYSTEM AND METHOD FOR REDUCING MR SCAN TIME USING PARTIAL FOURIER ACQUISITION AND COMPRESSED SENSING

BACKGROUND OF THE INVENTION

The invention relates generally to magnetic resonance imaging (MRI) and, more particularly, to MR image processing, including a method and apparatus to reduce the scan times associated with MR imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Typically, new MR imaging systems are a significant investment for an entity, including the MR imaging system itself as well as the cost of constructing a specialized suite to house the system. Due the high cost of purchasing and maintaining an MR imaging system, there are usually a limited number of such systems in operation at a given location. The high ratio of patients requiring MR scans to the number of available MRI systems makes patient throughput a critical feature of the MRI system. One common way to increase patient throughput is by decreasing the scan time for each patient.

Generating an MR image involves taking a series of repeated measurements. Generally, each series of measurements corresponds to a 3D slice of the area being imaged. One magnetic gradient, known as the slice select gradient, is used to determine the width of the slice. A second magnetic gradient, the phase encoding gradient, is used to spatially vary the phase of the emitted signal along the axis of the phase encoding gradient, while a third frequency encoding gradient is used to spatially vary the frequency of the emitted signal along the axis of the frequency encoding gradient. The total time required to complete a scan of the 3D slice may be calculated using the following expression:

Total imaging time=$TR \times N \times NSA$, where TR is the time between repeated measurements (or the time between phase encoding steps), N is the number of phase encoding steps, and NSA is the number of signal averages.

As an example, an imaging sequence may require 128 phase encoding steps. For each phase encoding step, there may be 256 frequency encoding steps during which measurements are taken. The time required to complete all 256 frequency encoding steps, together with the number of signal averages, determines the length of time between repeated measurements, or the time between phase encoding steps (TR). Moreover, the measurements taken during each particular phase encoding step may be repeated to improve the signal-to-noise ratio. The number of repetitions per phase encoding step is referred to as the number of signal averages (NSA).

In MR imaging, the scan time can be reduced by using partial Fourier acquisition to omit some of the phase encoding steps on one side of k-space. Data acquired using this technique can be reconstructed using a variation of Hermitian conjugate symmetry or by zero-filling. Zero-filling generally gives poor image quality compared to Hermitian conjugate symmetry (also known as homodyne reconstruction), except in some limited situations.

A newer method for reducing scan time is compressed sensing which also allows for fewer phase encoding steps than would be required for Nyquist sampling. Data acquired using compressed sensing is reconstructed using an L1-norm constraint to recover missing information. Until now, efforts to combine compressed sensing with partial Fourier acquisition have yielded less than optimal results due to the fact that zero filling, the only known algorithm for reconstructing the data, generally gives poor image quality.

It would therefore be desirable to have a system and method capable of combining compressed sensing and partial Fourier acquisition that can produce high-quality reconstructed MR images.

BRIEF DESCRIPTION OF THE INVENTION

According to one aspect of the invention, an MRI apparatus includes a magnetic resonance imaging (MRI) system having a plurality of gradient coils positioned about a bore of a magnet, an RF transceiver system and an RF switch controlled by a pulse generator that transmits signals to an RF coil assembly to acquire MR images. The system also includes a computer programmed to acquire a partial MR data set in k-space along a phase encoding direction, the data set having missing data in the phase encoding direction due to the omission of phase encoding steps. The computer is further programmed to generate an estimate of a reconstructed image, compensate the partial MR data set for the missing data, and reconstruct an MR image by iteratively minimizing the total squared difference between the k-space data of the estimate of the reconstructed image and the measured k-space data of the compensated partial MR data set.

In accordance with another aspect of the invention, a method of MR imaging that includes the steps of acquiring a partial MR data set in k-space along a phase encoding direction, the data set having missing data in the phase encoding direction due to omission of phase encoding steps. The method further includes generating an estimate of a reconstructed image, compensating for the partial data set acquisition, and reconstructing an MR image through iterative minimization of the total squared difference between the k-space data for the estimate of the reconstructed image and the measured k-space data of the compensated partial MR data set.

Yet another aspect of the invention includes a computer-readable storage medium having a computer program stored thereon. The computer program includes instructions which, when executed by a computer, cause the computer to acquire a partial MR data set in k-space along a phase encoding direction, the data set having missing data in the phase encoding direction due to omission of phase encoding steps. The program instructions further cause the computer to generate an estimate of a reconstructed image, compensate the partial MR data set for the missing data, and reconstruct an MR image by iteratively minimizing the total squared difference between the k-space data of the estimate of the reconstructed image and the measured k-space data of the compensated partial MR data set.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
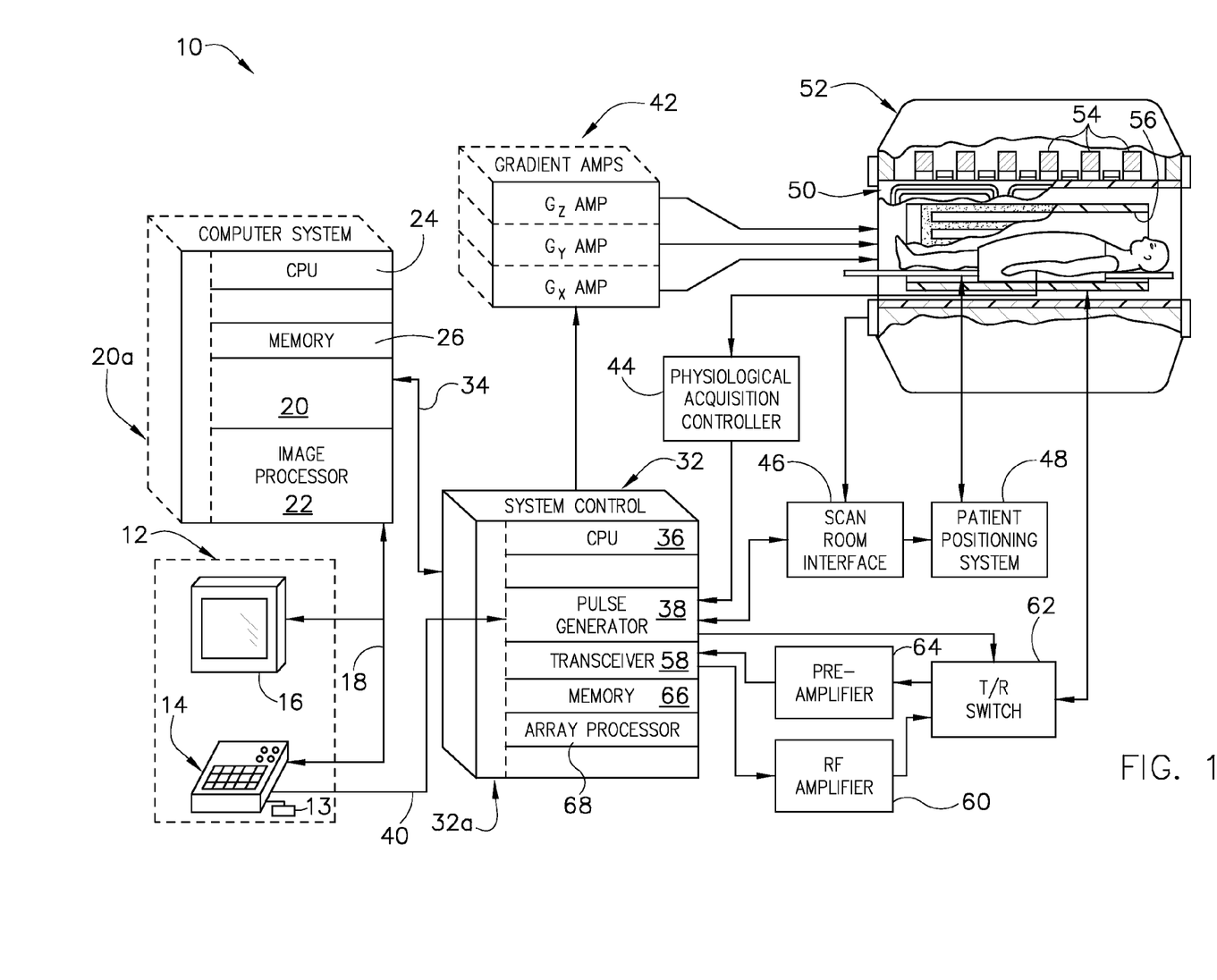
FIG. 1 is a schematic block diagram of an exemplary MR imaging system for use with an embodiment of the invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
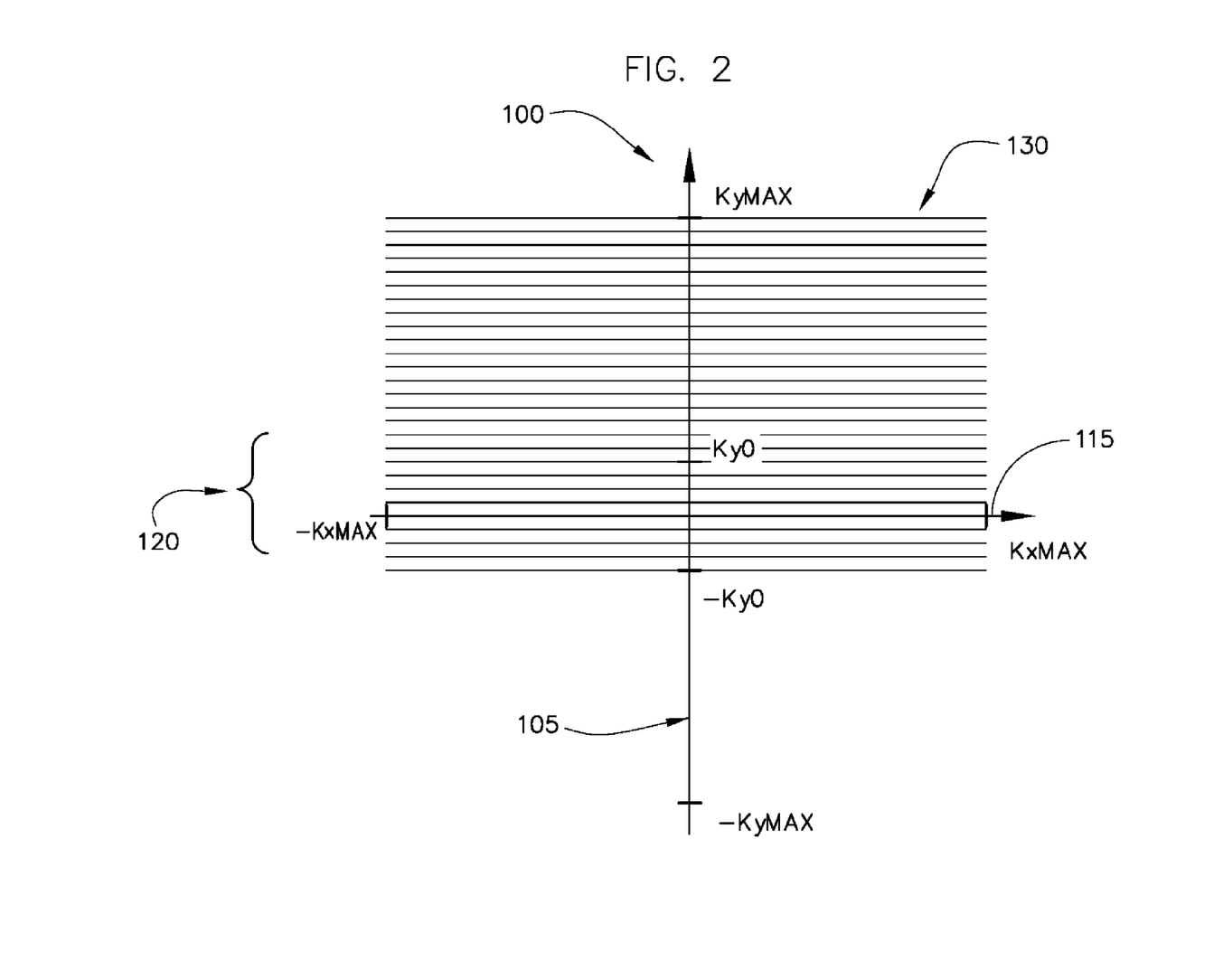
FIG. 2 is a two-dimensional representation of k-space including an example of a partial MR data set acquired using partial Fourier acquisition according to embodiments of the invention.

Referring to FIG. 2, in a 2D k-space 100, the data are acquired symmetrically over a range $(-k_{y\ max}, k_{y\ max})$ for a fully-sampled k-space data set. In a partial Fourier acquisition, the data are acquired over a range $(-k_{y0}, k_{y\,max})$ where $(-k_{y0}, k_{y0})$, a narrow band also known as the overscan radius, is a fully-sampled region. One skilled in the art would recognize that, for a partial Fourier acquisition, the k-space data may be similarly acquired over a range $(-k_{y\,max}, k_{y0})$. Data collected in this range $(-k_{y0}, k_{y0})$ are used to construct a phase correction for accurate partial Fourier reconstruction. For that reason, no phase encoding steps are omitted during MR data acquisition within the $(-k_{y0}, k_{y0})$ range.

FIG. 2 illustrates an example of 2D k-space 100 in which $(-k_{y0}, k_{y0})$ and $(-k_{y0}, k_{y\,max})$ are depicted on the $k_y$ 105 axis. In this embodiment, the overscan radius is 10 percent of $k_{y\,max}$, such that $k_{y0}=0.1k_{y\,max}$, or $(-k_{y0}, k_{y0})=(-0.1k_{y\,max}, 0.1k_{y\,max})$. Typically, this region is fully sampled. In other words, no undersampling techniques, whether compressed sensing or partial Fourier acquisition, are applied to the fully-sampled region 120, near the $k_x$ axis 100. One skilled in the art will appreciate that it is also possible to omit frequency encoding steps, but that the overscan radius would then be fully sampled in the $k_x$, or frequency encoding, direction. In an embodiment where frequency encoding is applied in the $k_x$ direction, there would be no omission of frequency encoding steps in the $(-0.1k_{x\,max}, 0.1k_{x\,max})$ range.

Partial Fourier acquisition reduces scan time by omitting phase encoding steps on one side of k-space 100. In the embodiments disclosed, phase encoding steps are depicted as horizontal lines crossing the y-axis $(k_y)$ 105 in k-space 100, and frequency encoding steps are understood to be points on those horizontal lines. A partial Fourier acquisition generally results in an MR data population of about 55% or more of k-space 100. In one embodiment, the partial MR data set 130 following a partial Fourier acquisition is as shown in FIG. 2, where the acquired data in the partial MR data set 130 extends from $(-k_{x\,max}, k_{x\,max})$ along the $k_x$ axis 115 and from $(-k_{y0}, k_{y\,max})$ along the $k_y$ axis 105. One skilled in the art would also be able to envision an embodiment where the partial MR data set 130 extends from $(-k_{y\,max}, k_{y0})$ along the $k_y$ axis 105. Generally, MR image data 130 acquired using partial Fourier acquisition can be reconstructed using one of two reconstruction methods to replace the data not acquired due to the omission of phase encoding steps: zero-filling and homodyne reconstruction (or Hermitian conjugate symmetry). Zero-filling, as the name implies, replaces missing data in the k-space range with zeroes. Zero-filling generally has poor image quality compared to that obtained using Hermitian conjugate symmetry.

One assumption underlying Hermitian conjugate symmetry is that for any real-valued image, the Fourier transform of data on one side of k-space 100 is equal to the complex conjugate of the Fourier transform of data on the other side of k-space 100. That is:

$$F(-k_y)=F^*(k_y) \quad \text{(Eqn. 1),}$$

where * denotes a complex conjugate. Eqn. 1 shows that, in 2D k-space 100, a complete MR image can be reconstructed with data from two of the four quadrants.

Due to various instrumental effects present in all MR systems, all MR images have an imaginary component which results in an image that is complex, not real. As a result, an MR image reconstructed using Hermitian conjugate symmetry from only half of the k-space data will contain imperfections. To compensate for the complex nature of the MR image, data are collected from more than half k-space 100. One embodiment of the invention reconstructs an MR image using an MR data set 130 containing 55% of data in the phase encoding direction, which in this case is the $k_y$ direction.

Typically, following partial Fourier acquisition, Hermitian conjugate symmetry is used to replace the missing 45% of k-space data. The reconstructed image m is given by $$\hat{m}=\text{real}\{e^{-i\phi_L}F_{1D}^{-1}[Hy]\} \quad \text{(Eqn. 2),}$$

where y is the 1D acquired k-space data collected from range $(-k_0, k_{max})$, $F_{1D}^{-1}$ is the inverse 1D Fourier transform operator, H is a high-pass homodyne filter, and $\Phi_L$ is a low-frequency estimate of the image phase given by:

$$\phi_L = \angle\{F_{1D}^{-1}[Ly]\} \quad \text{(Eqn. 3),}$$

where L is a low-pass homodyne filter, and $\angle$ is a symbol which calls for taking the phase of the complex image.

However, the conventional method for reconstructing an image from data acquired using partial Fourier acquisition is not necessarily compatible with the conventional method for reconstructing an image from data acquired using compressed sensing. As will be shown below, to combine the two methods, it helps to have one image reconstruction technique that works for both data acquisition methods. An embodiment of the invention reconstructs an MR image from partial Fourier acquisition by solving a least-squares problem wherein the complex image m is reconstructed by solving:

$$\hat{m}_c = \underset{m}{\text{argmin}}[f(m)] \text{ where } f(m) = \|F_{1D}(e^{i\phi_L}m) - Hy\|_2^2, \quad \text{(Eqn. 4)}$$

where y is the fully-sampled (full Fourier) k-space data. The notation "argmin" means that $\hat{m}$ is a function that minimizes f(m). The notation $\| \|_p$ indicates the Lp-norm where p is any real number. In general, the Lp-norm of a sequence of complex variables is defined as:

$$\|x\|_p = \left(\sum_k |x_k|^p\right)^{1/p}. \quad \text{(Eqn. 5)}$$

For example, the L2-norm of the expression f(m) above is the total squared difference of the reconstructed image (via Fourier transform) and the measured k-space data. In this context, the word "total" refers to the summation of the expression on the right side of the Lp-norm equation. Because the f(m) expression in Eqn. 4 shows an L2-norm squared, it is unnecessary to take the square root of the sum as would normally be the case with the L2-norm.

To arrive at a solution for the case when y is only partially sampled using partial Fourier acquisition, the complex image m undergoes the same phase-correction and high-pass filtering used in the homodyne reconstruction of Eqn. 2. Taking the real part of $\hat{m}_c$, the solution becomes:

$$\hat{m}_c = \text{real}\left\{\underset{m}{\text{argmin}}[f(m)]\right\} \text{ where } f(m) = \|F_{1D}(e^{i\phi_L}m) - Hy\|_2^2, \quad \text{(Eqn. 6)}$$

yielding essentially the same solution as that obtained by using the fast Fourier transform with the Homodyne algorithm in Eqn. 2. The $F_{1D}$ operator can be replaced with the general 2D or 3D Fourier operator F with the understanding that Fourier transforms are to be taken in the non-homodyne directions first.

Figure 3:
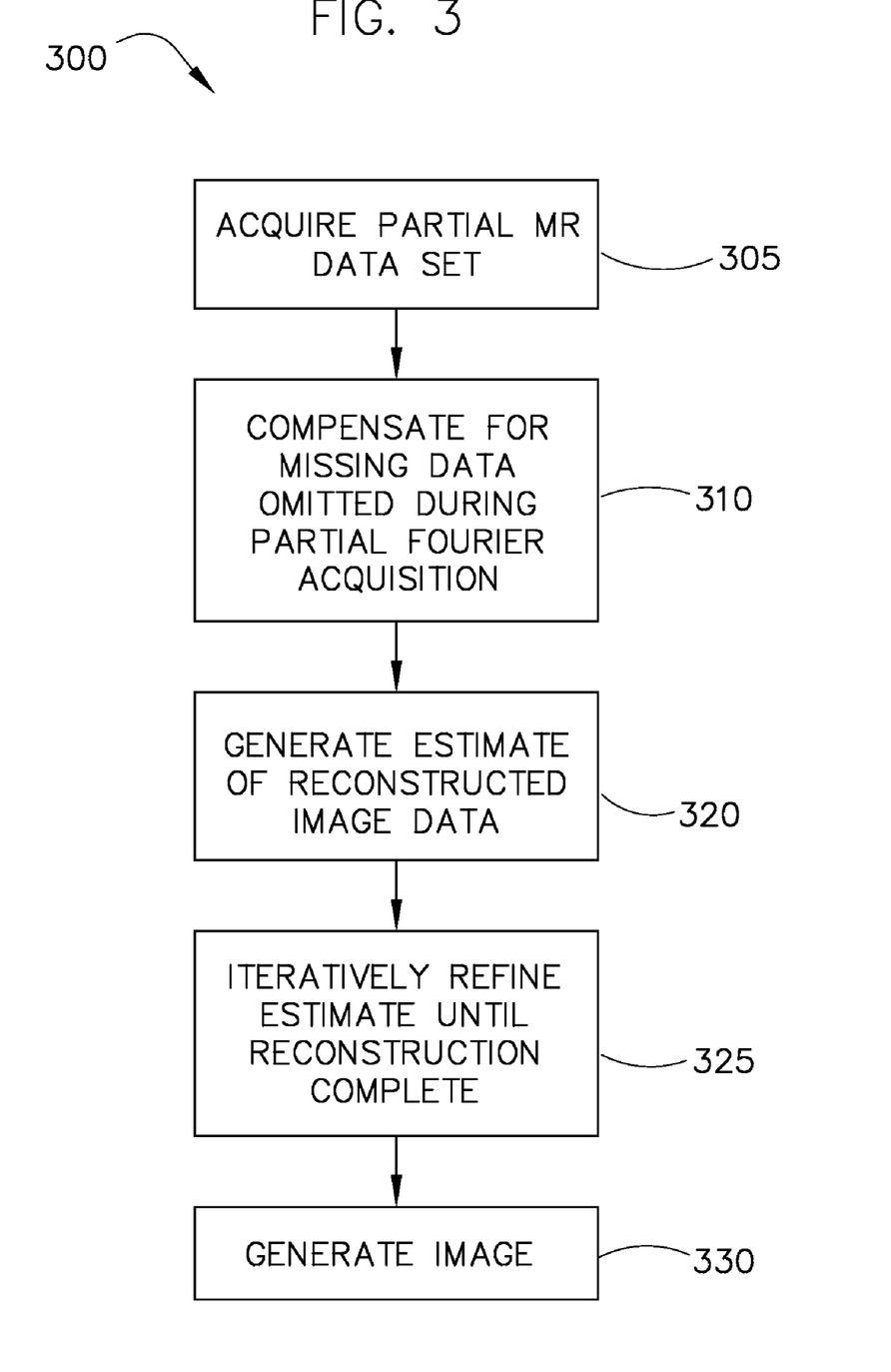
FIG. 3 is a flowchart of an image reconstruction technique according to embodiments of the invention.

Referring to FIG. 3, a sequence of operations to create a reconstructed image after partial Fourier acquisition is shown in technique 300. A partial MR data set is acquired at STEP 305 by conducting an MR scan or by retrieving the data from stored computer memory. In one embodiment, the partial MR data set includes all of k-space on one side of the $k_x$ axis plus 10% of contiguous k-space on the other side of the $k_x$ axis. A high-pass filter is applied to the partial MR data set to compensate for the missing k-space data at STEP 310. Then, an initial estimate of the reconstructed image is generated at STEP 320. An MR image can be reconstructed at STEP 325 by solving Eqn. 6, which includes iteratively minimizing the total squared difference between the k-space data of the estimate of the reconstructed image and the measured k-space data of the compensated partial MR data set. During each iteration, the estimate of the reconstructed image is refined until the difference between the Fourier transform of the estimated image and the measured, high-pass filtered, k-space data is minimized. After a phase correction, the Fourier transform of the previous estimate is compared to the post-compensation k-space data. The estimate is refined and the comparison is repeated. This iterative process at STEP 325 is repeated until the Fourier transform of the estimated image is essentially the same as the post-compensation k-space data. After the final iteration, a reconstructed image is generated at STEP 330.

Compressed sensing is another technique for reducing the number of phase encoding steps needed to reconstruct an MR image. Compressed sensing originates from the observation that most medical images have some degree of compressibility. Compressibility means that when transformed into some suitable basis such as a wavelet basis, a substantial number of values can be set to zero with little loss of image quality. Compressed images are reconstructed using an L1-norm constraint to recover the missing information. One key component of compressed sensing is that undersampling artifacts must be somewhat incoherent in order for the L1-norm constraint to reconstruct the correct image. This is accomplished by randomly omitting phase encoding steps.

Figure 4:
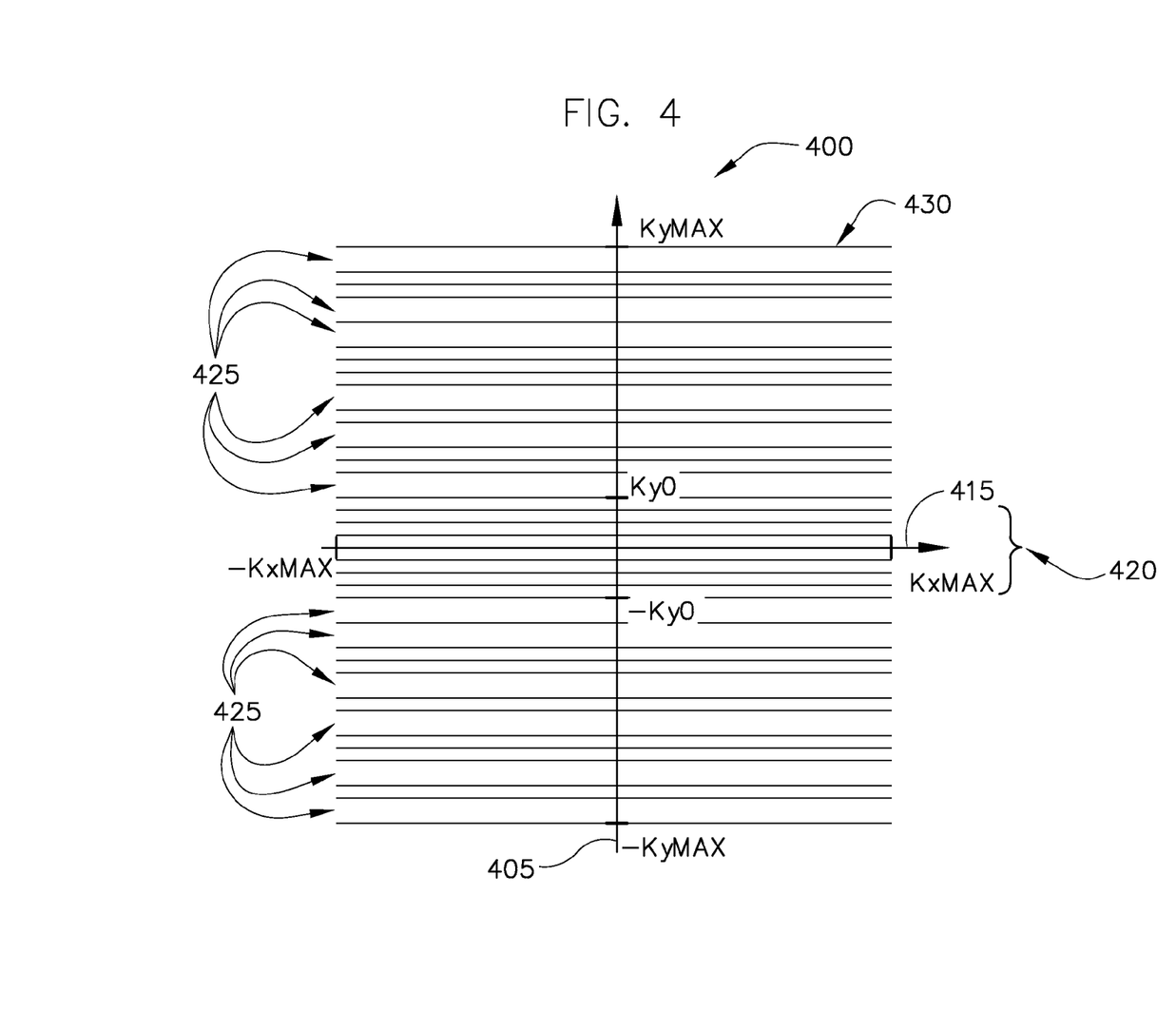
FIG. 4 is a two-dimensional representation of k-space including an example of a partial MR data set acquired using compressed sensing according to embodiments of the invention.

FIG. 4 shows a 2D k-space 400 and a partial MR data set 430 in which compressed sensing acquisition is used to acquire the data. In 2D k-space 400, the omission of phase encoding steps per the compressed sensing acquisition is indicated by missing horizontal lines 425 along the $k_y$ axis 405. As with the partial Fourier acquisition shown in FIG. 2, full sampling is performed in the narrow band near the $k_x$ axis 415, a band known as the overscan radius 420. That is, the random undersampling caused by the compressed sensing acquisition technique is applied only outside of the overscan radius 420. Which phase encoding steps are omitted may be determined by a computer-based random number generator. Because the omitted steps 425 are determined by the algorithm in the computer program, the process may not be truly random. That is, the random numbers generated by a computer may only be pseudo-random. However, one skilled in the art may appreciate that embodiments of the invention may include employing truly random number generators. As used herein, "random" includes both a pseudo-random and a truly random selection of omitted phase-encoding steps 425.

Typically, compressed sensing employs one or more sparsifying transforms to differentiate between MR image data that is significant and that which is negligible. The negligible image data is discarded thereby reducing the amount of data needed to reconstruct the image. One embodiment of the invention uses two sparsifying transforms commonly used in medical imaging; the wavelet transform and the gradient operator. Applying these two sparsifying transforms to the L1-norm constraint reconstruction, the reconstructed image $\hat{m}$ of the compressed image m is obtained by:

$$\hat{m} = \mathrm{argmin}_m [f(m)] \text{ where } f(m) = \lambda_W \|Wm\|_1 + \lambda_{TV} \|\nabla m\|_1 + \|Fm - y\|_2^2, \quad (\text{Eqn. 7})$$

Where $\nabla$ is the gradient operator, and $\lambda$ is a constant that depends on the image noise level and can be varied to change the relative weightings of the L1-norm constraint. The L1-norm of the gradient of a function may be referred to as the total variation (TV) of the function as used in Eqn. 7. Minimizing $\|Wm\|_1$ and $\|\nabla m\|_1$ ensures that the reconstructed image has a high degree of sparsity (i.e., the image is compressed). Minimizing $\|Fm-y\|_2^2$ ensures that the reconstructed image is consistent with the actual measured k-space data.

Figure 5:
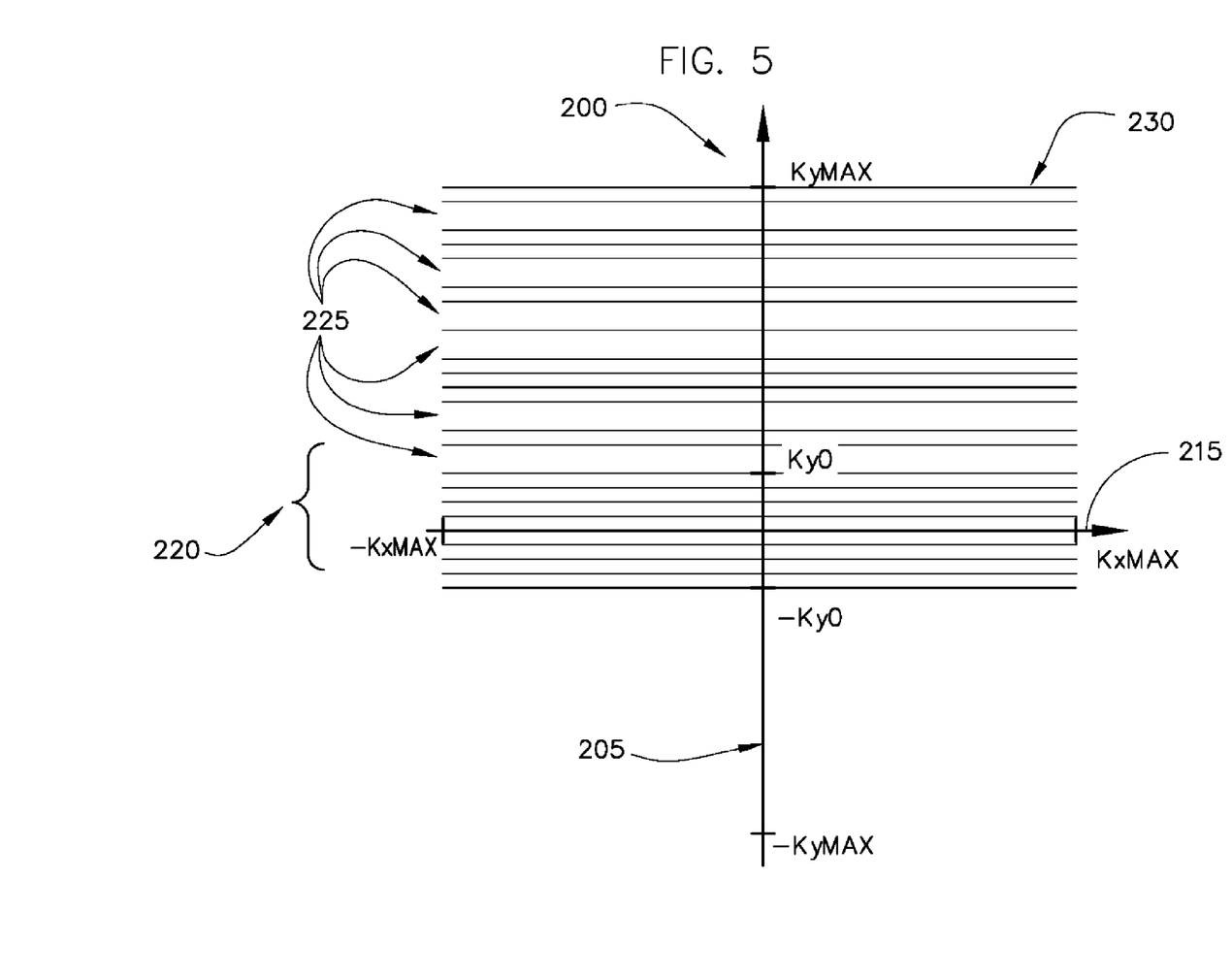
FIG. 5 is a two-dimensional representation of k-space including an example of a partial MR data set acquired using a combination of compressed sensing and partial Fourier acquisition according to embodiments of the invention.

In an embodiment of the invention shown in FIG. 5, compressed sensing is combined with partial Fourier acquisition. The randomly omitted phase encoding steps 225 from compressed sensing are combined with the 45% of omitted phase encoding steps from partial Fourier acquisition resulting in the partial MR data set 230. The combination allows for the omission of more phase encoding steps than could be omitted using either technique in isolation. Using both compressed sensing and partial Fourier acquisition, the reconstructed image $\hat{m}$ is found by minimizing both terms associated with the two sparsifying transforms and the term associated with the homodyne reconstruction as shown in the following expression:

$$\hat{m} = \mathrm{real}\left\{\mathrm{argmin}_m[f(m)]\right\} \text{ where } f(m) = \lambda_W \|Wm\|_1 + \lambda_{TV} \|\nabla m\|_1 + \|F[e^{i\phi_L}m] - Hy\|_2^2. \quad (\text{Eqn. 8})$$

One method for solving this Eqn. 8 involves using a non-linear conjugate gradient, which includes repeated evaluations of the objective function $f(m)$ and its gradient with respect to the image values to be estimated. Conjugate gradient reconstruction includes calculation of the term:

$$g = \nabla f(m) \quad (\text{Eqn. 9}),$$

where $f(m) = \lambda_W \|Wm\|_1 + \lambda_{TV} \|\nabla m\|_1 + \|F[e^{i\phi_L}m] - Hy\|_2^2$ \quad (Eqn. 10).

For a complex image m, the gradient is typically computed separately for each pixel in the image with respect to the real and imaginary parts of m such that:

$$g_{pq} = (\nabla f)_{pq} \Rightarrow \begin{pmatrix} \frac{\partial f}{\partial m_{Rpq}} \\ \frac{\partial f}{\partial m_{Ipq}} \end{pmatrix}, \quad (\text{Eqn. 11})$$

where p and q denote row and column numbers for a pixel in the 2D image. By performing a simple substitution, Eqn. 10 can be rewritten as:

$$f = \lambda_W f_W + \lambda_{TV} f_{TV} + f_2 \quad (\text{Eqn. 12}),$$

where $f_W = \|Wm\|_1$, $f_{TV} = \|\nabla m\|_1$, and $f_2 = \|F[e^{i\phi_L}m] - Hy\|_2^2$.

For image reconstruction, the gradient of each term is taken separately. For a complex image m, $$\|Wm\|_1 = \sum_{jk} \{|(Wm_R)_{jk}| + |(Wm_I)_{jk}|\}. \quad \text{(Eqn. 13)}$$

The gradient of $f_w$ is given by:

$$\frac{\partial f_W}{\partial m_{Rpq}} = \sum_{jk} (W^T)_{pqjk} \text{sign}[(Wm_R)_{jk}] = \{W^T \text{sign}[(Wm_R)]\}_{pq} = \{W^{-1} \text{sign}[(Wm_R)]\}_{pq} \quad \text{(Eqn. 14)}$$

and $$\frac{\partial f_W}{\partial m_{Ipq}} = \{W^{-1} \text{sign}[(Wm_I)]\}_{pq}. \quad \text{(Eqn. 15)}$$

To calculate the gradient of $f_{TV}$, the L1-norm of the gradient of m is first calculated by:

$$f_{TV} = \|\nabla m\|_1 = \sum_{jk} \{|(\nabla m_R)_{jk}| + |(\nabla m_I)_{jk}|\}, \quad \text{(Eqn. 16)}$$

where $$\nabla m_R = \sqrt{\left(\frac{\partial m_R}{\partial x}\right)^2 + \left(\frac{\partial m_R}{\partial x}\right)^2}. \quad \text{(Eqn. 17)}$$

A nearest-neighbor difference operator is used to approximate the partial derivatives. The partial derivatives are approximated as:

$$\frac{\partial m_R}{\partial x} = Dm_R \quad \text{(Eqn. 18)}$$

and $$\frac{\partial m_R}{\partial y} = m_R D^T. \quad \text{(Eqn. 19)}$$

where D can be written in matrix form as $$D = \begin{pmatrix} 1 & -1 & 0 & 0 & \\ 0 & 1 & -1 & 0 & \cdots \\ 0 & 0 & 1 & -1 & \\ & & \vdots & & \end{pmatrix}$$

Thus the gradient of $f_{TV}$ is given by:

$$\frac{\partial f_{TV}}{\partial m_{Rpq}} = \left[D^T\left(\frac{Dm_R}{\nabla m_R}\right)\right]_{pq} + \left[\left(\frac{m_R D^T}{\nabla m_R}\right)D^T\right]_{pq} \quad \text{(Eqn. 20)}$$

and $$\frac{\partial f_{TV}}{\partial m_{Ipq}} = \left[D^T\left(\frac{Dm_I}{\nabla m_I}\right)\right]_{pq} + \left[\left(\frac{m_I D^T}{\nabla m_I}\right)D^T\right]_{pq}. \quad \text{(Eqn. 21)}$$

To calculate the gradient of $f_2$, it is helpful to rewrite $f_2$ as:

$$f_2 = \sum_{jk} |F[e^{i\phi_L}m] - Hy|_{jk}^2 = \sum_{jk} |(F[e^{i\phi_L}m])_{jk} - (Hy)_{jk}|^2, \quad \text{(Eqn. 22)}$$

where $$(F[e^{i\phi_L}m])_{jk} = \sum_{pq} E_{jkpq} m_{pq} \quad \text{(Eqn. 23)}$$

and $$E_{jkpq} = e^{i2\pi(jp+kq)/N} e^{i\phi_{Lpq}} \quad \text{(Eqn. 24)},$$

where N in Eqn. 24 is the number of acquired phase encoding lines. Now $f_2$ becomes:

$$f_2 = \sum_{jk} \left| \sum_{ab} E_{jkab} m_{ab} - (Hy)_{jk} \right|^2. \quad \text{(Eqn. 25)}$$

After computing separate derivatives with respect to the real and imaginary parts of image m at each pixel:

$$\frac{\partial f_2}{\partial m_{Rpq}} = 2 \, \text{real}\left\{ \sum_{jk} E^*_{jkpq}(Em - Hy)_{jk} \right\} \quad \text{(Eqn. 26)}$$

and $$\frac{\partial f_2}{\partial m_{Ipq}} = 2 \, \text{imag}\left\{ \sum_{jk} E^*_{jkpq}(Em - Hy)_{jk} \right\}. \quad \text{(Eqn. 27)}$$

During each iteration in the conjugate gradient algorithm, the reconstructed image is updated based on the estimate generated during the previous iteration, each new iteration using a new gradient calculation and a distance t that minimizes f(m) at the new iteration. The line search method is a commonly used estimation method for finding t. A line search starts with an initial estimate of t and iteratively decreases it until an approximate minimum of f(m) at the new location is found.

Figure 6:
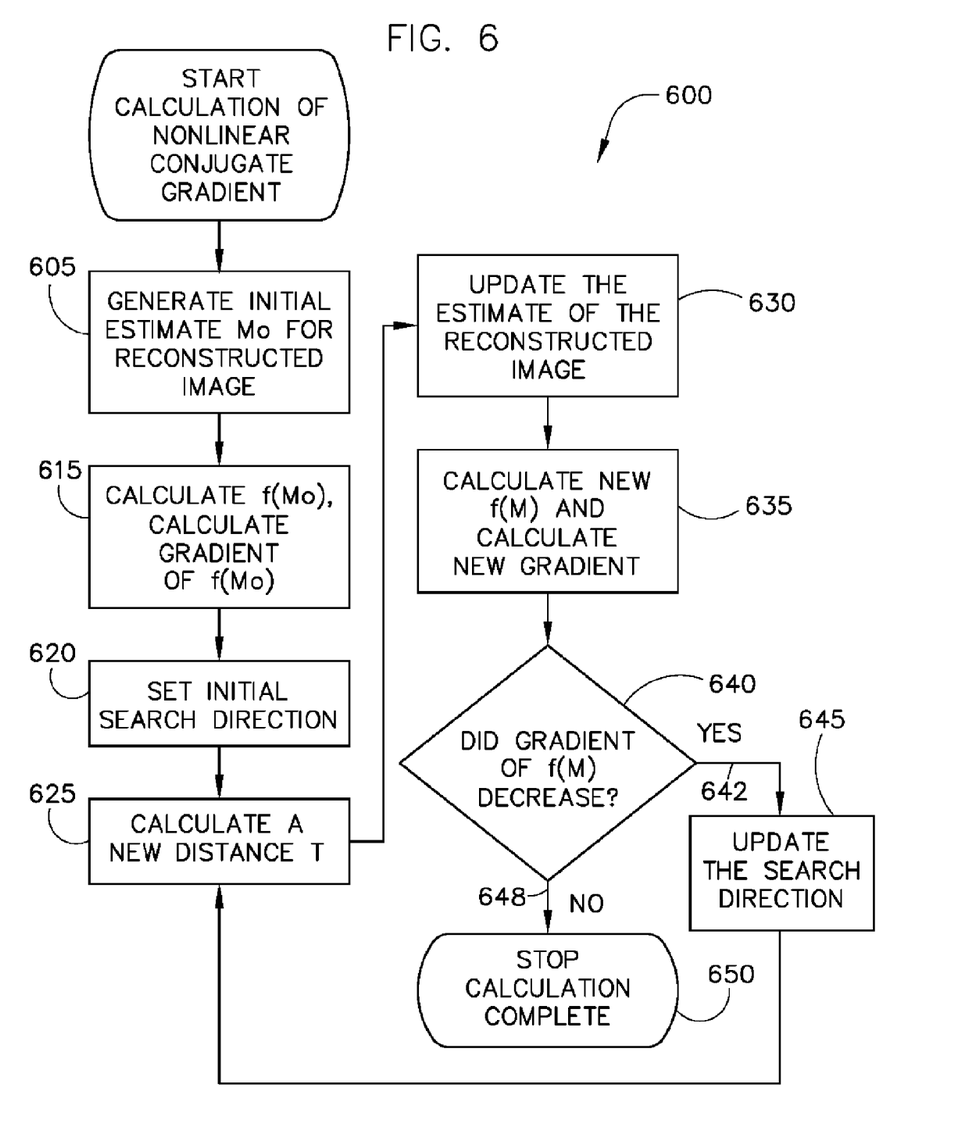
FIG. 6 is a flowchart for performing nonlinear conjugate gradient calculation according to embodiments of the invention.

FIG. 6 shows a technique 600 for using the nonlinear conjugate gradient to find the minimum of f(m) according to embodiments of the invention. Technique 600 begins at STEP 605 with the generation of an initial estimate $m_0$ of the reconstructed image and setting $\hat{m}=m_o$. This initial estimate can either be zero or a low frequency estimate of m calculated by windowing with the low-pass filter L. At STEP 615, $f_o=f(m_o)$ and $g_o=\nabla f(m_o)$ are each calculated. The gradient calculation is used to set the initial search direction to $p_o=-g_o$ at STEP 620. A new distance t is calculated at STEP 625. Any of several line search methods known in the art may be used to calculate distance t. The estimate of the reconstructed image is updated at STEP 630 using the formula $m_{n+1}=m_n+t_np_n$. The new estimate of the reconstructed image can be used at STEP 635 to calculate a new f(m), after which a new gradient of f(m), $g_{n+1}=\nabla f(m_{n+1})$, can be calculated. Then, a determination is made at STEP 640 as to whether the newly calculated f(m) decreases in value as compared to the previously calculated f(m). If there was a decrease 642, then the search direction is updated at STEP 645 using the formula $$p_{n+1} = -g_{n+1} + \frac{\|g_{n+1}\|_2^2}{\|g_n\|_2^2} p_n,$$

and the iteration number is increased such that n→n+1. Process control then returns to STEP 625 and iteratively repeats the steps from STEP 625 to STEP 640 until f(m) stops decreasing altogether or stops decreasing by some threshold amount. In another embodiment of the invention, not shown in flowchart 600, a fixed number of iterations may be performed. When f(m) stops decreasing 648, or stops decreasing by the threshold amount, the process terminates at STEP 650.

Figure 7:
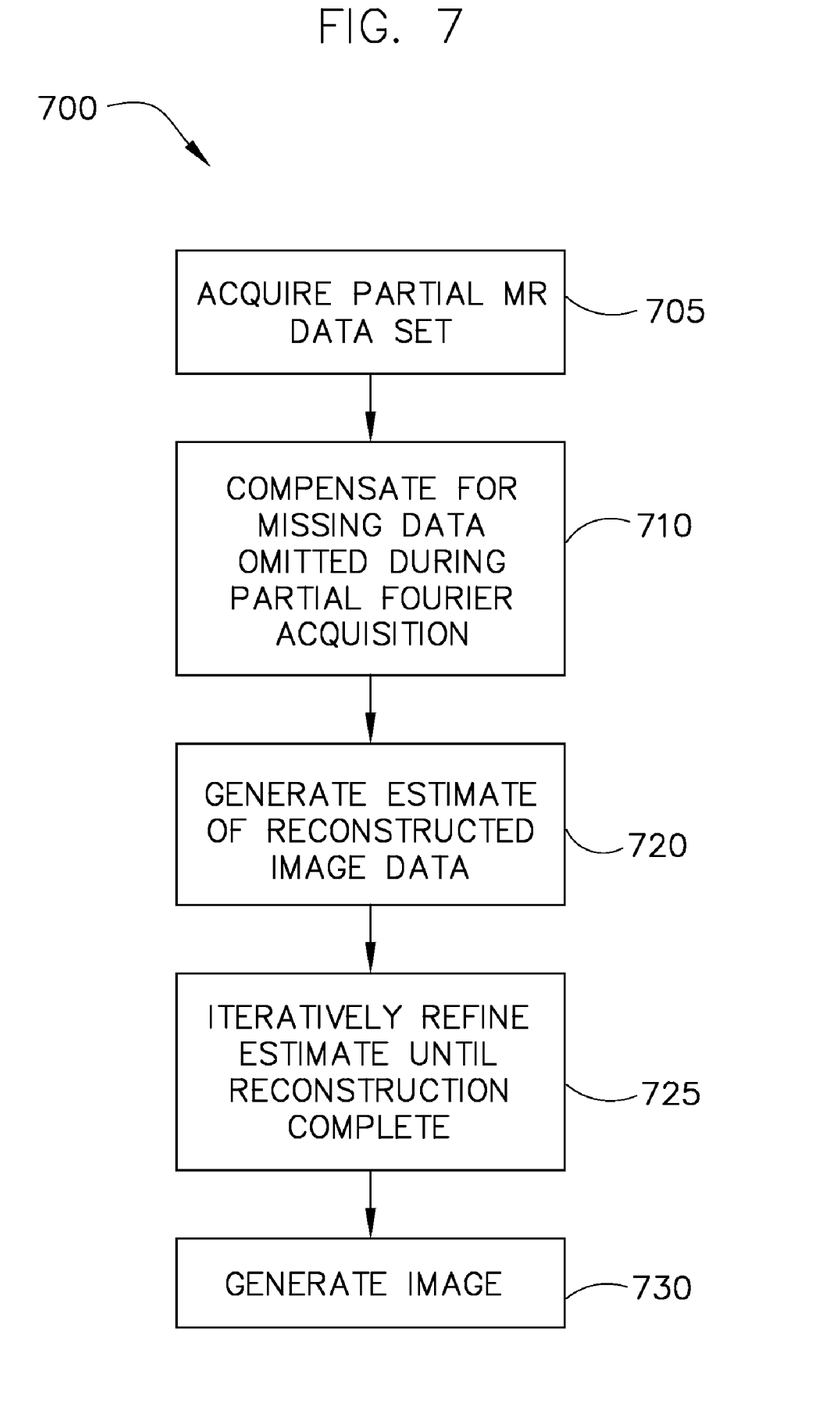
FIG. 7 is a flowchart of an image reconstruction technique according to embodiments of the invention.

FIG. 7 shows a technique 700 for creating a reconstructed image after combining compressed sensing and partial Fourier acquisition according to embodiments of the invention. A partial MR data set is acquired at STEP 705 by conducting an MR scan or by retrieving the data from stored computer memory. In one embodiment, the partial MR data set includes k-space data on all of one side of the $k_x$ axis, plus an adjacent 10 percent on the other side of the axis minus a plurality of randomly-selected phase encoding steps outside of the overscan radius. A high-pass filter is applied to the partial MR data set to compensate for the missing k-space data at STEP 710. Then, an initial estimate of the reconstructed image is generated at STEP 720. Image reconstruction at STEP 725 includes sparsifying transforms. As a result, an MR image can be reconstructed at STEP 725 by iteratively minimizing a sum of: 1) the absolute values of elements of the wavelet transform; 2) the absolute values of elements of the gradient operator; and 3) the total squared difference between the k-space data of the estimate of the reconstructed image and the measured k-space data of the compensated partial MR data set. As stated above, the reconstruction at STEP 725 uses an iterative process wherein an initial estimate of the reconstructed image is refined during each successive iteration. In one embodiment, the number of iterations is variable, meaning that the iterations continue until some threshold is reached (such as until the Fourier transform of the estimated image is essentially the same as the post-compensation k-space data) or until the function ƒ(m) has reached a minimum. In another embodiment, the reconstruction at STEP 725 is accomplished with the nonlinear gradient by performing a fixed number of iterations. After the final iteration, a reconstructed image is generated at STEP 730.

Figure 8:
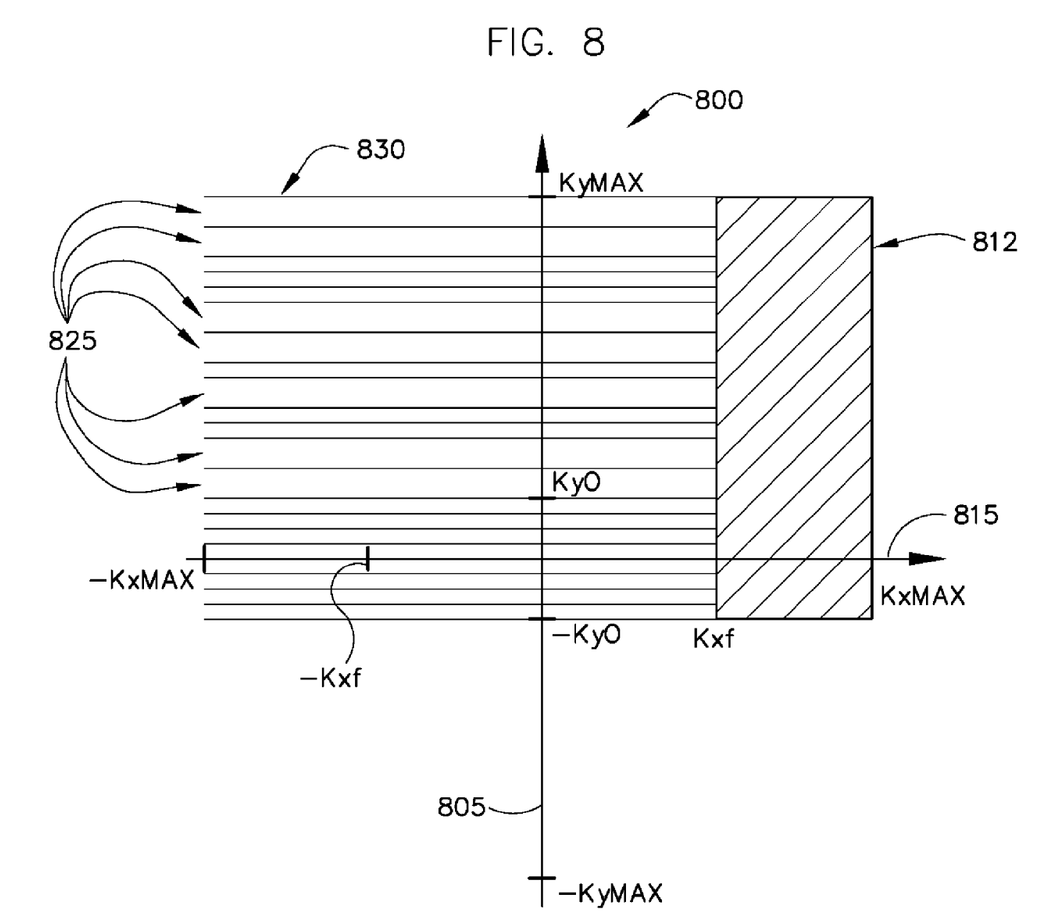
FIG. 8 is a two-dimensional representation of k-space including an example of a partial MR data set acquired using a combination of compressed sensing and partial Fourier acquisition and with additional missing data due to the omission of frequency encoding steps according to embodiments of the invention.

Referring to FIG. 8, one embodiment of the invention includes acquisition of a partial MR data set 830 in the frequency encoding direction in addition to acquiring MR data via a combination of compressed sensing and partial Fourier acquisition. For example, during each phase encoding step, an MR data scan could perform 75% of the maximum number of frequency encoding steps. As a result, the horizontal lines in k-space 830, each representing one phase encoding step, may have, for example, only 75% of possible values in the frequency encoding direction, which in this case is the $k_x$ direction. In this embodiment, the acquired partial MR data set 830 extends from $(-k_{x\,max}, k_{xf})$ along the $k_x$ axis 815 and from $(-k_{y0}, k_{y\,max})$ along the $k_y$ axis 805. The missing k-space data 812 in the $k_x$ direction is shown in FIG. 8 in a contiguous region in the range $(k_{xf}, k_{x\,max})$. One skilled in the art will be able to envision an embodiment in which the partial MR data set 830 in the $k_x$ direction could be acquired such that the missing data is contiguous in the range $(-k_{x\,max}, -k_{xf})$.

In the embodiment of FIG. 8, the technique 700 of FIG. 7 may be used to reconstruct an image, except that the acquisition of a partial MR data set at STEP 705 also includes the omission of 25% of frequency encoding steps 825 outside of the overscan radius. Also, STEP 710 includes zero-filling as part of the compensation for missing MR image data.

Figure 9:
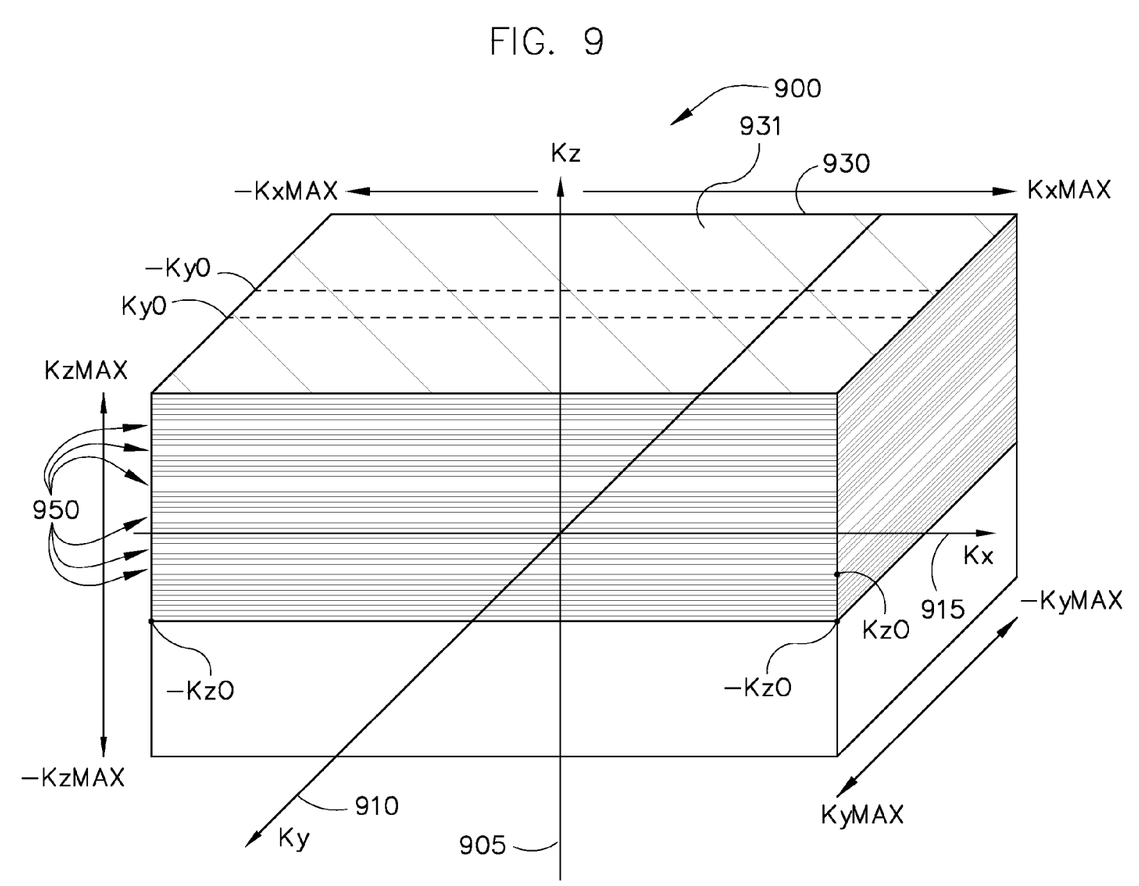
FIG. 9 is a three-dimensional representation of k-space including an example of a partial MR data set acquired using a combination of partial Fourier acquisition in one direction and compressed sensing in two directions.

According to yet another embodiment, the invention can be applied to three-dimensional (3D) scans where both phase encoding and compressed sensing are applied in two directions. The embodiment of FIG. 9 illustrates a three-dimensional k-space 900 extending from $-k_{x\,max}$ to $k_{x\,max}$ in the $k_x$ direction, from $-k_{y\,max}$ to $k_{y\,max}$ in the $k_y$ direction, and from $-k_{z\,max}$ to $k_{z\,max}$ in the $k_z$ direction. In this embodiment, phase encoding is applied in the $k_y$ and $k_z$ directions, while frequency encoding is applied in the $k_x$ direction. A partial MR data set 930 is acquired in the $k_z$ direction using partial Fourier acquisition and compressed sensing in the $k_y$ and $k_z$ directions. The data set 930 comprises a series of planes 931 in the $k_x$ and $k_y$ directions, each plane 931 extending from $-k_{x\,max}$ to $k_{x\,max}$ in the $k_x$ direction, and substantially from $-k_{y\,max}$ to $k_{y\,max}$ in the $k_y$ direction. Due to partial Fourier acquisition, the planes 931 extend from $k_{z\,max}$ to $-k_{z0}$ in the $k_z$ direction, where $k_{z0}$ is the overscan radius and may be equal to, for example, $0.1k_{z\,max}$. As in the two-dimensional embodiment described above in FIG. 4, individual planes 931 are fully sampled (i.e., no omitted phase encoding steps) near the $k_y$ axis 910 within the overscan radius which extends from $-k_{y0}$ to $k_{y0}$, or $-0.1k_{y\,max}$ to $0.1k_{y\,max}$. Outside of the overscan radius, each plane 931 has randomly omitted phase encoding lines (not shown) due to compressed sensing.

The use of phase encoding in the $k_z$ direction allows for the acquisition of a partial MR data set 930 in that direction as well, further reducing scan time. Referring to FIG. 9, the partial data set 930 is fully sampled (i.e., no missing planes due to omitted phase encoding steps) in the region near the $k_z$ axis 910 within the overscan radius which extends from $-k_{z0}$ to $k_{z0}$, or, for example, $-0.1\,k_{z\,max}$ to $0.1\,k_{z\,max}$. However, the use of partial Fourier acquisition combined with compressed sensing in the $k_z$ direction results in a data set 930 from which data is acquired on one side of the $k_z$ axis 905 and the contiguous 10% of k-space on the other side of the $k_z$ axis 905. In the range $k_{z0}$ to $k_{z\,max}$ the random omission of phase encoding steps due to compressed sensing results in some missing planes 950 in the $k_z$ direction. No MR data is acquired in the range from $-k_{z0}$ to $-k_{z\,max}$ due to partial Fourier acquisition in the $k_z$ direction. As with the two-dimensional example above, a reconstructed three-dimensional image from the three-dimensional partial MR data set 930 is obtained by solving Eqn. 8 for each plane 931 in the data set 930.

Figure 10:
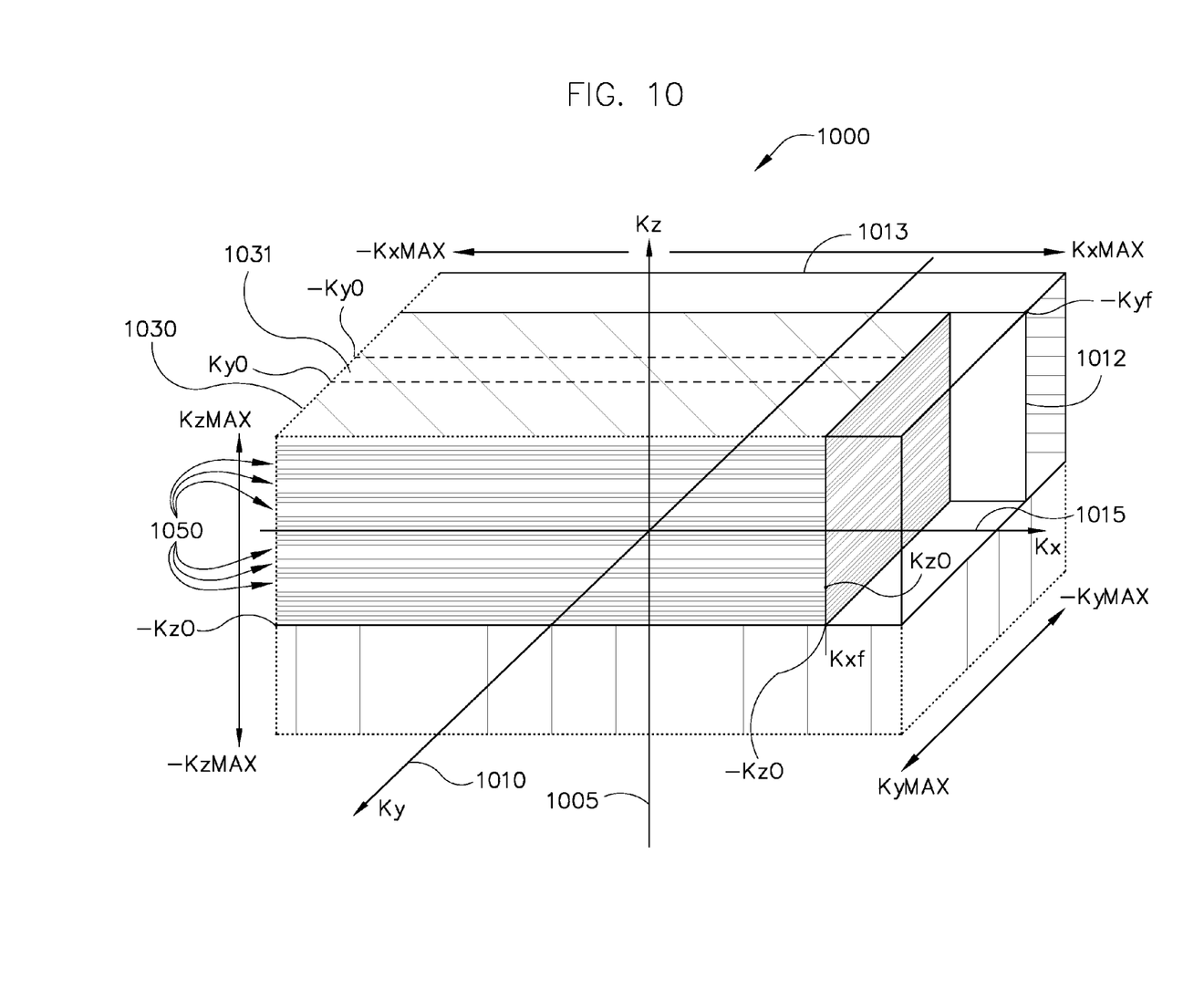
FIG. 10 is a three-dimensional representation of k-space including an example of a partial MR data set acquired using a combination of partial Fourier acquisition in one direction and compressed sensing in two directions and with regions where missing data is replaced by zero-filling.

Another embodiment of a 3D partial MR data set acquisition is shown in FIG. 10. According to the embodiment shown, a partial MR data set 1030 is acquired in a manner similar to that described in FIG. 9, except that the individual planes 1031 in data set 1030 only occupy 75% of k-space in the $k_x$ direction and 75% of k-space in the $k_y$ direction. Each plane 1031 in data set 1030 extends from $-k_{x\,max}$ to $k_{xf}$ in the $k_x$ direction, where $k_{xf}$ is equal to 0.5 $k_{x\,max}$. Planes 1031 also extend from $-k_{yf}$ to $k_{y\,max}$ in the $k_y$ direction, where $k_{yf}$ is equal to 0.5 $k_{y\,max}$. The missing data 1012 in the $k_x$ direction, and the missing data 1013 in the $k_y$ direction are replaced by zero-filling. As in the previous example, compressed sensing is applied in the $k_y$ and $k_z$ directions resulting in randomly omitted planes 1031 in the $k_z$ direction, while each plane 1031 will have randomly omitted lines in the $k_y$ direction. A reconstructed three-dimensional image from the three-dimensional partial MR data set 1030 is obtained by solving Eqn. 8 for each plane 1031 in the data set 1030.

One skilled in the art will understand that an embodiment similar to that shown in FIG. 10, except that zero-filling is applied in one direction (e.g., either $k_x$ or $k_y$) and data is collected over the full range in the other direction, is within the scope of this invention.

A technical contribution for the disclosed method and apparatus is that it provides for a computer implemented to operate an MR imaging system and includes a method and apparatus for reducing the scan times associated with MR imaging.

According to one embodiment of the invention, an MRI apparatus includes a magnetic resonance imaging (MRI) system having a plurality of gradient coils positioned about a bore of a magnet, an RF transceiver system and an RF switch controlled by a pulse generator to transmit signals to an RF coil assembly to acquire MR images. The system also includes a computer programmed to acquire a partial MR data set in k-space along a phase encoding direction, which in this case is the $k_y$ direction. The data set may have some missing data due to omission of phase encoding steps in the $k_y$ direction. The computer is further programmed to generate an estimate of a reconstructed image, compensate the partial MR data set for the missing data, and reconstruct an MR image by iteratively minimizing the total squared difference between the k-space data of the estimate of the reconstructed image and the measured k-space data of the compensated partial MR data set.

In accordance with another embodiment of the invention, a method of MR imaging that includes acquiring a partial MR data set, which may have some missing data due to the omission of phase encoding steps, in k-space along a $k_y$ direction, then generating an estimate of a reconstructed image. The method further includes compensating for the partial data set acquisition, and reconstructing an MR image through iterative minimization of the total squared difference between the k-space data for the estimate of the reconstructed image and the measured k-space data of the compensated partial MR data set.

Yet another embodiment of the invention includes a computer-readable storage medium having a computer program stored thereon. The computer program includes instructions which, when executed by a computer, cause the computer to acquire a partial MR data set. The partial data set may have some missing data due to the omission of phase encoding steps. The program also includes instructions that cause the computer to generate an estimate of a reconstructed image, compensate the partial MR data set for the missing data, and reconstruct an MR image by iteratively minimizing the total squared difference between the k-space data for the estimate of the reconstructed image and the measured k-space data of the compensated partial MR data set.

The invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet, an RF transceiver system and an RF switch controlled by a pulse generator to transmit signals to an RF coil assembly to acquire MR images; and
   a computer programmed to:
   acquire a partial MR data set in k-space along a phase encoding direction, the data set having missing data in the phase encoding direction due to omission of phase encoding steps;
   generate an estimate of a reconstructed image;
   compensate the partial MR data set for the missing data; and
   reconstruct an MR image by iteratively minimizing the total squared difference between the k-space data of the estimate of the reconstructed image and the measured k-space data of the compensated partial MR data set.

2. The MRI apparatus of claim 1 wherein the computer, in being programmed to reconstruct an MR image, is programmed to reconstruct an MR image $\hat{m}_c$ using a formula given by:

$$\hat{m}_C = \text{real}\left\{\operatorname*{argmin}_m [f(m)]\right\} \text{ where } f(m) = \|F_{1D}(e^{i\phi_L}m) - Hy\|_2^2,$$

wherein m is a complex image, y is a k-space data set, H is a high-pass homodyne filter, $i\phi_L$ is a low-frequency estimate of image phase, and $\|\cdot\|_2$ represents an L2-norm operation.

3. The MRI apparatus of claim 1 wherein the computer, in being programmed to minimize the total squared difference between the k-space data for the estimate of the reconstructed image and the measured k-space data of the compensated partial MR data set, is programmed to carry out the minimization using a nonlinear conjugate gradient.

4. The MRI apparatus of claim 1 wherein the computer, in being programmed to acquire a partial MR data set in k-space along a phase encoding direction, is programmed to omit MR data in k-space along a frequency encoding direction, the resulting data set having missing data in the frequency encoding and phase encoding directions and to replace the missing data in the frequency encoding direction by zero-filling.

5. The MRI apparatus of claim 1 wherein the computer, in being programmed to acquire a partial MR data set in k-space along a phase encoding direction, is programmed to randomly omit phase encoding steps during the partial MR data set acquisition.

6. The MRI apparatus of claim 5 wherein the computer, in being programmed to reconstruct an MR image, is programmed to reconstruct the MR image by iteratively minimizing a sum of: 1) the absolute values of elements of a plurality of sparsifying transforms; and 2) the total squared difference between the k-space data for the estimate of the reconstructed image and the measured k-space data of the compensated partial MR data set.

7. The MRI apparatus of claim 6 wherein the computer, in being programmed to omit phase encoding steps in one phase encoding direction, is programmed to omit phase encoding steps along a second phase encoding direction and to replace the missing data in the second phase coding direction by zero-filling.

8. The MRI apparatus of claim 7 wherein the computer, in being programmed to omit phase encoding steps in a second phase encoding direction and to replace the missing data in the second phase coding direction by zero-filling, is programmed to randomly omit phase encoding steps in the second phase encoding direction.

9. A method of MR imaging comprising:
acquiring a partial MR data set in k-space along a phase encoding direction, the data set having missing data in the phase encoding direction due to omission of phase encoding steps;
generating an estimate of a reconstructed image;
compensating for the partial data set acquisition; and
reconstructing an MR image through iterative minimization of the total squared difference between the k-space data for the estimate of the reconstructed image and the measured k-space data of the compensated partial MR data set.

10. The method of claim 9 wherein acquiring a partial MR data set comprises acquiring the partial MR data set using a combination of partial Fourier acquisition and compressed sensing.

11. The method of claim 9 wherein acquiring a partial MR data set comprises one of initiating an MR scan to acquire the data set and retrieving the partial MR data set from stored computer memory.

12. The method of claim 9 wherein acquiring a partial MR data set comprises randomly omitting phase encoding steps during the MR data set acquisition.

13. The method of claim 9 wherein acquiring a partial MR data set comprises acquiring a partial MR data set having missing data in the frequency encoding and phase encoding directions and replacing the missing data in the frequency encoding direction by zero-filling.

14. A computer-readable storage medium having stored thereon a computer program comprising instructions which when executed by a computer cause the computer to:
acquire a partial MR data set in k-space along a phase encoding direction, the data set having missing data in the phase encoding direction due to omission of phase encoding steps;
generate an estimate of a reconstructed image;
compensate the partial MR data set for the missing data; and
reconstruct an MR image by iteratively minimizing the total squared difference between the k-space data of the estimate of the reconstructed image and the measured k-space data of the compensated partial MR data set.

15. The computer-readable storage medium of claim 14 wherein the computer program, in comprising instructions to reconstruct an MR image, comprises instructions to reconstruct the MR image using a fixed number of iterations to minimize a sum of: 1) the absolute values of elements of a plurality of sparsifying transforms; and 2) the total squared difference between the k-space data of the estimate of the reconstructed image and the measured k-space data of the compensated partial MR data set.

16. The computer-readable storage medium of claim 14 wherein the computer program, in comprising instructions to acquire a partial MR data set, further comprises instructions to omit MR data in k-space along a frequency encoding direction, the resulting data set having missing data in the frequency encoding and phase encoding directions.

17. The computer-readable storage medium of claim 16 wherein the computer program, in comprising instructions to omit MR data in k-space along a frequency encoding direction, further comprises instructions to replace the missing data in the frequency encoding direction by zero-filling.

18. The computer-readable storage medium of claim 14 wherein the computer program, in comprising instructions to acquire a partial MR data set, comprises instructions to randomly omit phase encoding steps during the MR data set acquisition.

19. The computer-readable storage medium of claim 18 wherein the computer program, in comprising instructions to reconstruct an MR image, comprises instructions to reconstruct the MR image by iteratively minimizing a sum of: 1) the absolute values of elements of a plurality of sparsifying transforms; and 2) the total squared difference between the k-space data of the estimate of the reconstructed image and the measured k-space data of the compensated partial MR data set.

20. The computer-readable storage medium of claim 18 wherein the computer program, in comprising instructions to acquire a partial MR data set, comprises instructions to acquire the partial MR data set using a combination of compressed sensing and partial Fourier acquisition.

\* \* \* \* \*